United States Patent
Lai

(10) Patent No.: US 7,382,144 B2
(45) Date of Patent: Jun. 3, 2008

(54) TEST FIXTURE FOR HOLDING SIGNAL TERMINALS OR PINS AND RELATED METHOD FOR ASSEMBLING THE TEST FIXTURE

(75) Inventor: Han-Kuang Lai, Taipei Hsien (TW)

(73) Assignee: Wistron Corporation, Hsi-Chih, Taipei Hsien (TW)

( * ) Notice: Subject to any disclaimer, the term of this patent is extended or adjusted under 35 U.S.C. 154(b) by 0 days.

(21) Appl. No.: 11/279,256

(22) Filed: Apr. 11, 2006

(65) Prior Publication Data

US 2007/0200570 A1 Aug. 30, 2007

(30) Foreign Application Priority Data

Feb. 8, 2006 (TW) .............................. 95104216 A

(51) Int. Cl.
*G01R 31/02* (2006.01)
(52) U.S. Cl. .................. 324/755; 324/761; 324/754
(58) Field of Classification Search .................... None
See application file for complete search history.

(56) References Cited

U.S. PATENT DOCUMENTS

| | | | |
|---|---|---|---|
| 4,033,656 A * | 7/1977 | Freehauf et al. ............ 439/525 |
| 4,739,446 A * | 4/1988 | Landis .................... 361/689 |
| 4,923,405 A * | 5/1990 | Munsterman et al. ......... 439/78 |
| 5,174,763 A * | 12/1992 | Wilson .................... 439/66 |
| 5,205,742 A * | 4/1993 | Goff et al. ................ 439/73 |
| 5,959,248 A * | 9/1999 | Ishiguro ................... 174/53 |
| 6,294,920 B1 * | 9/2001 | Pfaff ...................... 324/755 |
| 6,334,783 B1 * | 1/2002 | Hu ........................ 439/84 |
| 6,494,736 B2 * | 12/2002 | Mito ...................... 439/385 |
| 6,758,682 B1 * | 7/2004 | Kosmala .................. 439/66 |
| 6,798,228 B2 * | 9/2004 | Cuevas ................... 324/755 |
| 6,937,045 B2 * | 8/2005 | Sinclair .................. 324/761 |
| 6,951,489 B2 * | 10/2005 | Sekiguchi ................ 439/700 |
| 7,102,373 B2 * | 9/2006 | Yoshida .................. 324/755 |
| 7,134,878 B2 * | 11/2006 | Zheng et al. .............. 439/65 |
| 7,154,286 B1 * | 12/2006 | Marx et al. ............... 324/761 |
| 7,201,613 B2 * | 4/2007 | Sasaki .................... 439/700 |

* cited by examiner

*Primary Examiner*—Paresh Patel
(74) *Attorney, Agent, or Firm*—Winston Hsu

(57) ABSTRACT

A test fixture has a socket, a plurality of signal terminals, and a fixing module. A plurality of holes are formed in the socket for installing the signal terminals. The fixing module is installed on the socket to fix the signal terminals in the holes. The number of the signal terminals of the test fixture can be adjusted for various purposes.

14 Claims, 19 Drawing Sheets

TEST FIXTURE FOR HOLDING SIGNAL TERMINALS OR PINS AND RELATED METHOD FOR ASSEMBLING THE TEST FIXTURE

BACKGROUND OF THE INVENTION

1. Field of the Invention

The present invention relates to a test fixture and a related method for assembling the test fixture, and more particularly, to test fixture for holding signal terminals and a related method for assembling the test fixture.

2. Description of the Prior Art

To ensure that electric products can operate normally and steadily in long usage duration, the electric products usually need to undergo various quality control (QC) tests before mass production or leaving the factory. Even though some of the QC tests can be executed with the help of automatic test machines, some of the QC tests still need to be done manually. When manually executing a QC test, it is necessary to choose a test fixture with a proper number of signal terminals according to the number of I/O ports of the tested electric product. However, because conventional test fixtures are generally not inter-compatible and the signal terminals are not easy to be fastened, the cost of conventional test fixtures is high and the lifetime of conventional test fixtures is short.

SUMMARY OF THE INVENTION

The present invention discloses a test fixture for holding signal terminals. The test fixture comprises a socket formed with a plurality of holes each of which is for placing a corresponding signal terminal, and a fixing module removably attached to the socket for restricting the signal terminals in the holes. The socket comprises a plurality of protrusions each of which is formed in a corresponding one of the holes for contacting one end of the corresponding signal terminal. Each of the signal terminals is restricted between the fixing module and the protrusion formed in the corresponding hole.

The present invention also discloses a method for assembling a test fixture re and a plurality signal terminals. The method comprises installing a plurality of signal terminals into a plurality of holes of a socket to make a first end of each of the signal terminals contact a protrusion formed in a corresponding hole and to expose a probe and a pin of each of the signal terminals outside the corresponding hole, and removably installing a fixing module on the socket to restrict the signal terminals in the holes.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
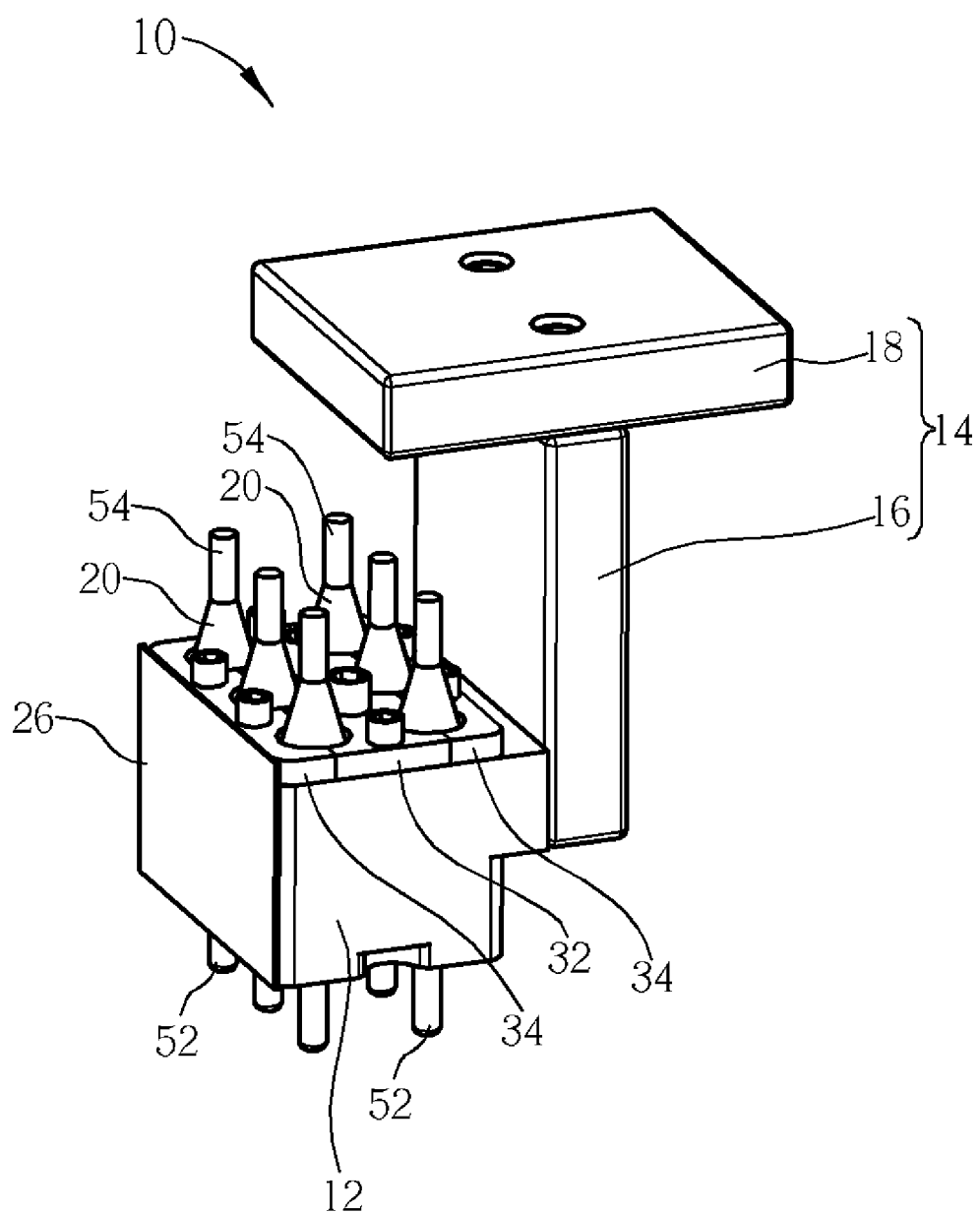
FIG. 1 is a perspective diagram of a test fixture according to the present invention.
Figure 2:
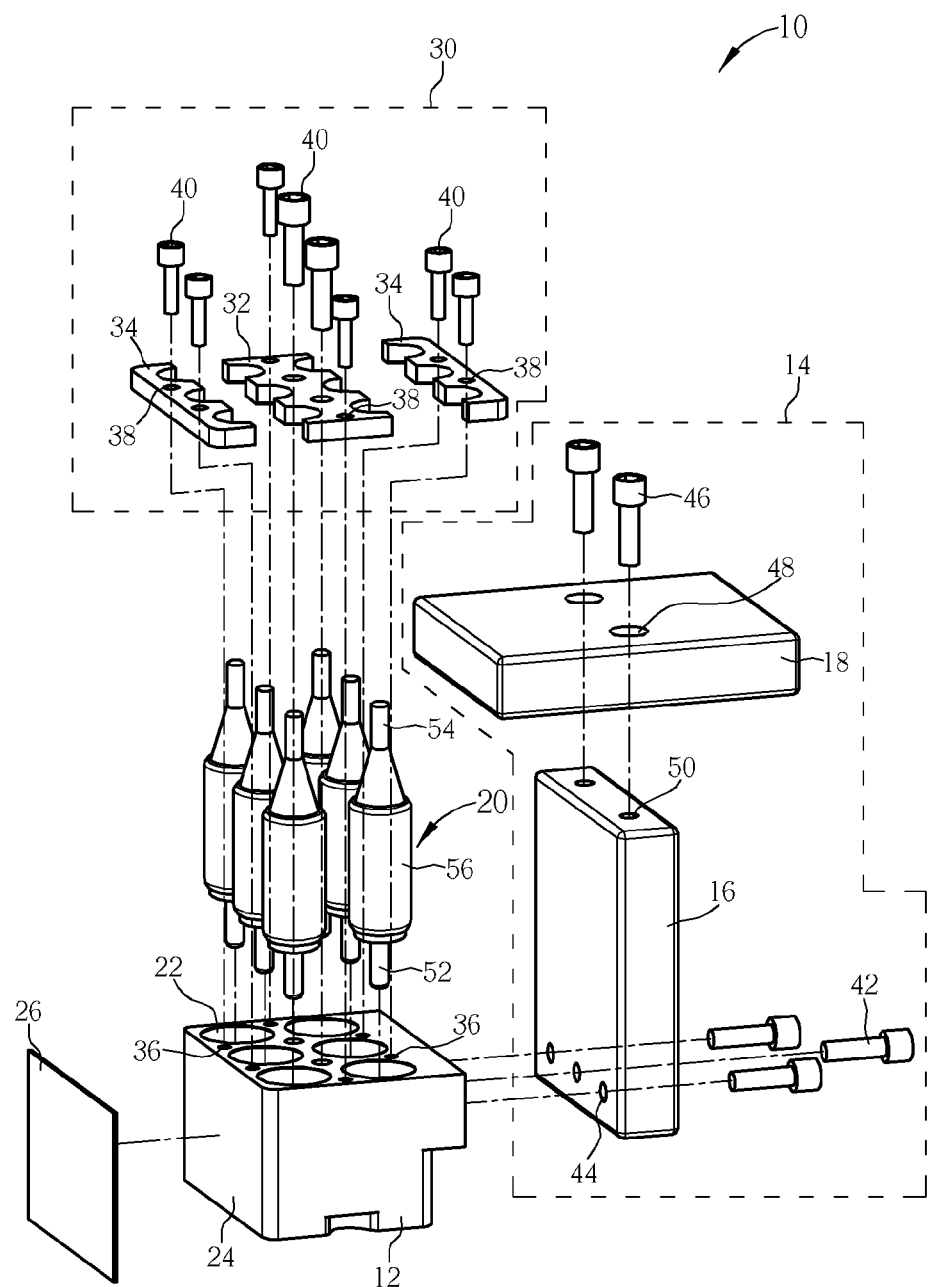
FIG. 2 is an exploded diagram of the test fixture shown in FIG. 1.

Please refer to FIGS. 1-2. FIG. 1 is a perspective diagram of a test fixture 10 according to the present invention, and FIG. 2 is an exploded diagram of the test fixture. The test fixture is used to provide convenience to a QC employee to execute QC tests. The QC employee connects a device under test (DUT) to a test machine via the test fixture 10 so that the test machine can test the DUT via the test fixture 10. The test fixture 10 comprises a socket 12, a handle 14, a plurality of signal terminals 20, and a fixing module 30. With the help of the handle 10, the QC employee is capable rapidly connecting the test fixture 10 to the test machine or removing the test fixture 10 from the test machine. The handle 14 comprises a stick 16 and a shaft 18. A plurality of apertures 44 and 48 are respectively formed in the stick 16 and the shaft 18. Screws 42 pass through the apertures 44 to fasten the stick 16 onto the handle 12. Therefore, the bottom end of the stick 16 is connected to the socket 12. Screws 46 pass through the apertures 48 to be threaded into the screw holes 50 to connect the top end of the stick 16 to the shaft 18. In the embodiment, the shaft 18 is vertical to the stick 16, so the QC employee can easily control movement of the test fixture 10 via the handle 14.

A plurality of holes 22 are formed in the socket 12 for placing the signal terminals 20. Each of the signal terminals 20 is fixed in a corresponding one of the holes 22. The signal terminals are made of metal material to transmit electric signals. Each of the signal terminals 20 comprises a body 56, a probe 52, and a pin 54. When the signal terminal 20 is installed in the hole 22, the body 56 contacts the bottom of the hole 22, and the probe 52 and the pin 54 are exposed outside hole 22. The test fixture 10 further comprises a fixing module 30 for restricting the bodies 56 of the signal terminals 20 in the holes 22. The fixing module 30 comprises a first fixing unit 32, two second fixing units 34, and a plurality of screws 40. There are a plurality of apertures 38 respectively formed in the first fixing unit 32 and the second fixing units 34. Screws 40 pass through the apertures 38 to be threaded into the screw holes 36. When the screws 40 are threaded into the screw holes 36, the first fixing unit 32 and the second fixing units 34 of the fixing module 30 clamp the top ends of the bodies 56 of the signal terminals 20 so that the bodies 56 of the signal terminals 20 are restricted in the holes 22. The number of the signal terminals 20 installed in the socket 12 can be changed according to the needs of the QC tests. When the QC employee wants to change the number of the signal terminals 20 installed in the socket 12, he/she just needs to remove the fixing units 32 and 34 of the fixing module 30 and to rearrange the signal terminals 20 before screwing the fixing module 30 again. In the embodiment, there are six holes 22 formed in the socket 12, so the maximum number of signal terminals 20 installed in the socket 12 is six. However, it should be noted that the number of holes of the socket of the test fixture according to the present invention is not limited to six. The test fixture 10 further comprises a pad 16 for preventing scrapes disposed on one side 24 of the socket 12. The friction coefficient of the pad 26 is less then the friction coefficient of side 24 of the socket 12. When the QC employee uses the test fixture 10 to execute QC tests, the pad 26 contacts the DUT so that the chance that the test fixture 10 scrapes the DUT is reduced.

Figure 3:
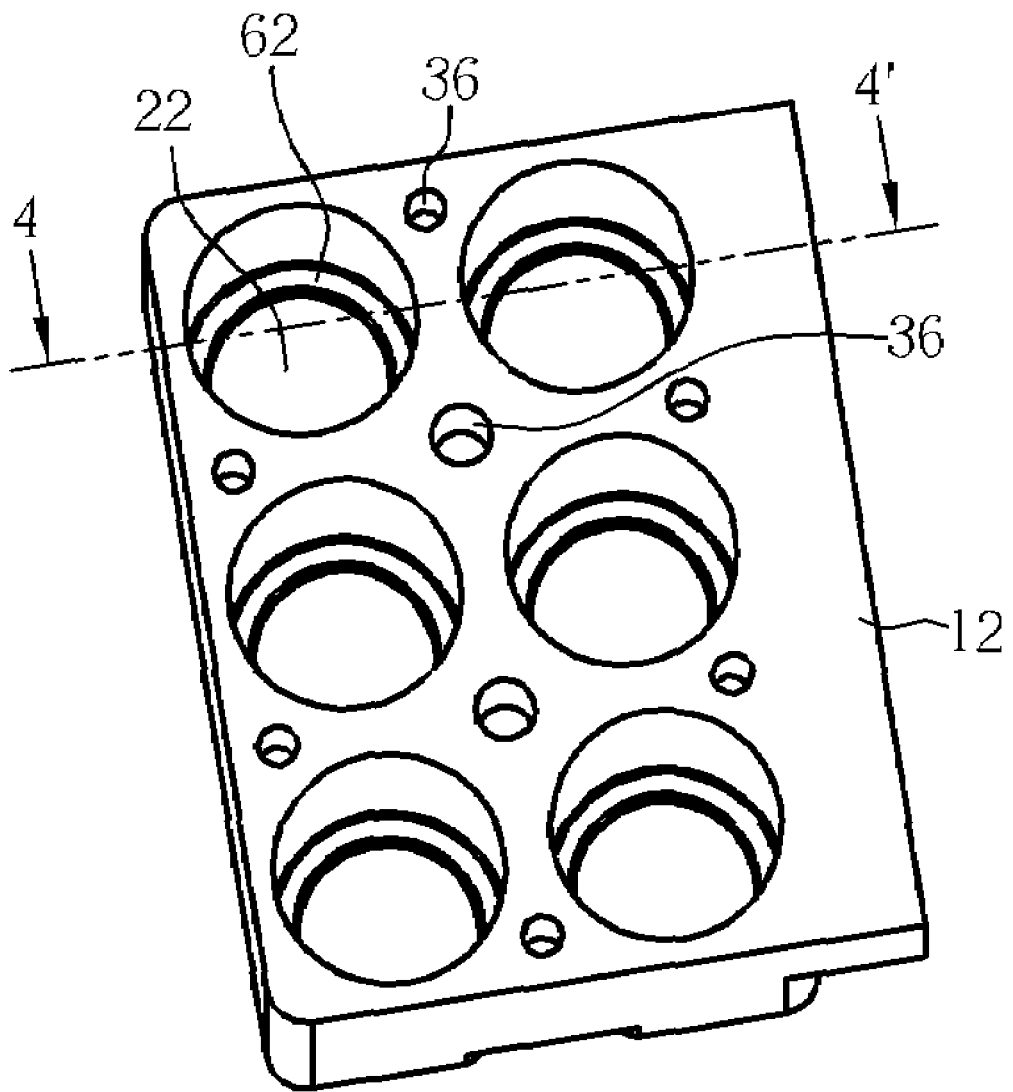
FIG. 3 is a perspective diagram of the socket shown in FIG. 2.
Figure 4:
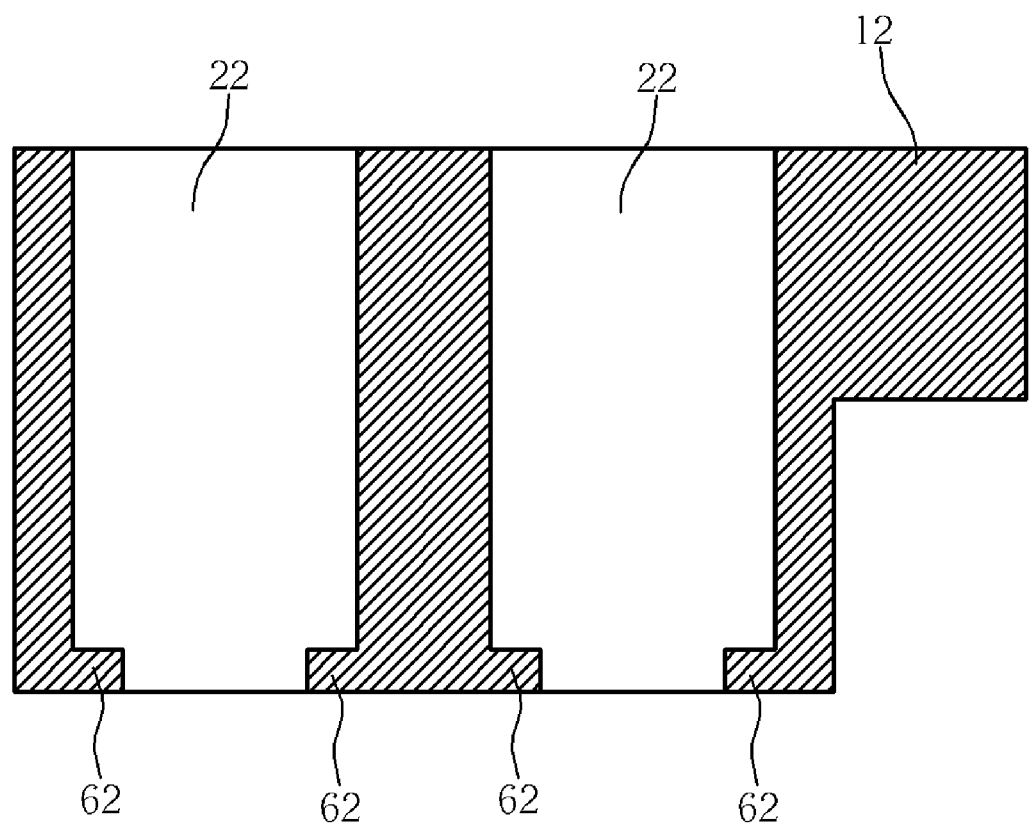
FIG. 4 is a cross-sectional diagram of the socket along the line 4-4' shown in FIG. 3.
Figure 5:
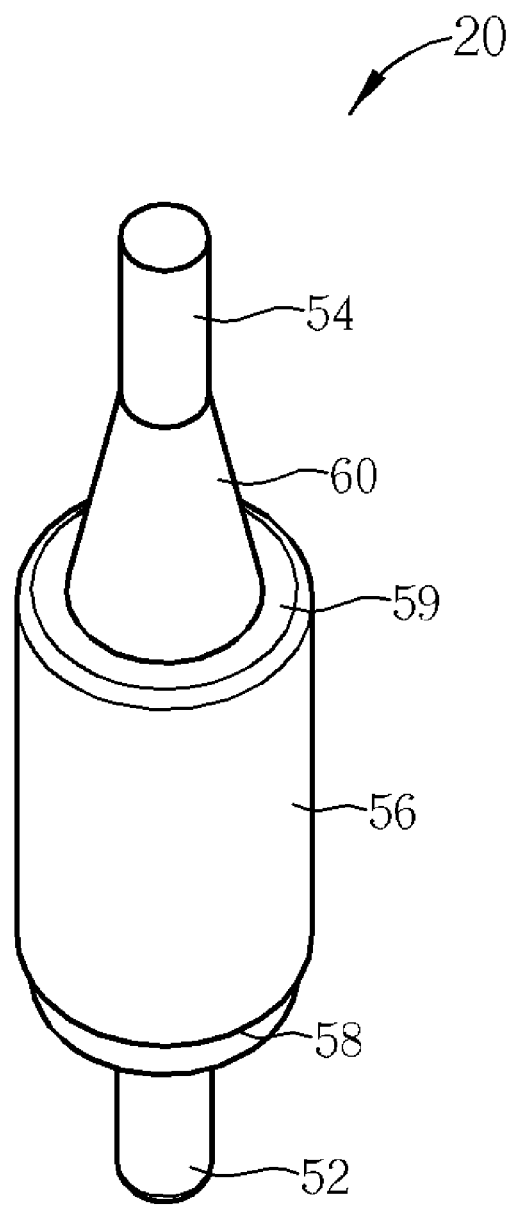
FIG. 5 is a perspective diagram of the signal terminal shown in FIG. 1.
Figure 6:
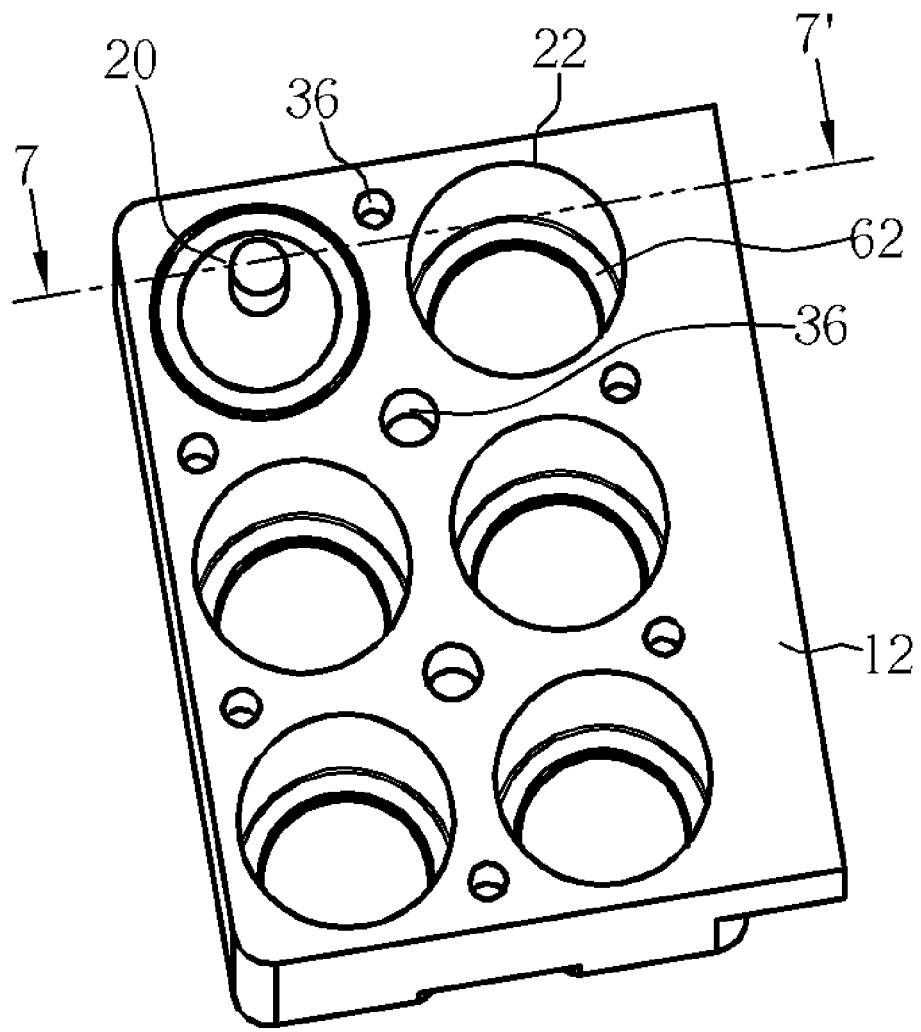
FIG. 6 is a perspective diagram of the socket with a signal terminal installed in the hole shown in FIG. 2.
Figure 7:
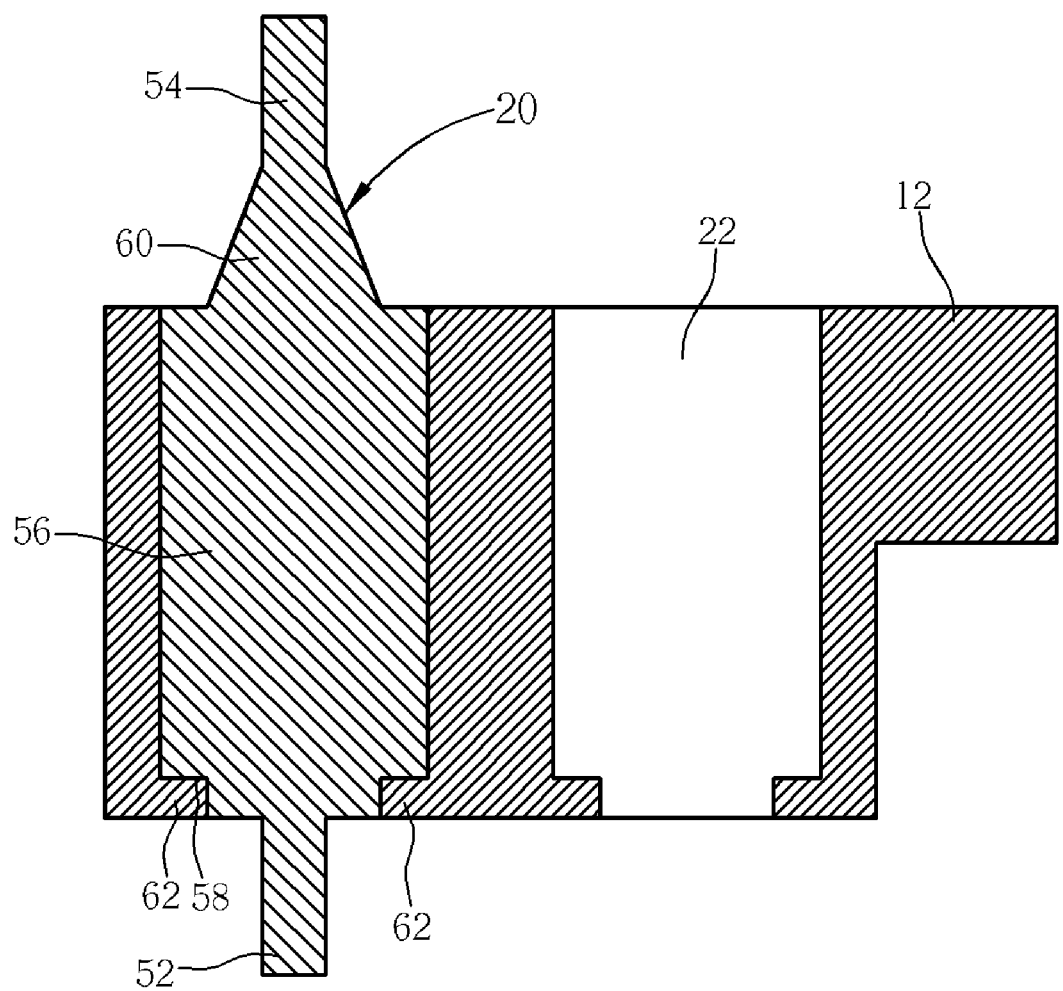
FIG. 7 is a cross-sectional diagram of the socket and the signal terminal along the line 7-7' shown in FIG. 6.
Figure 8:
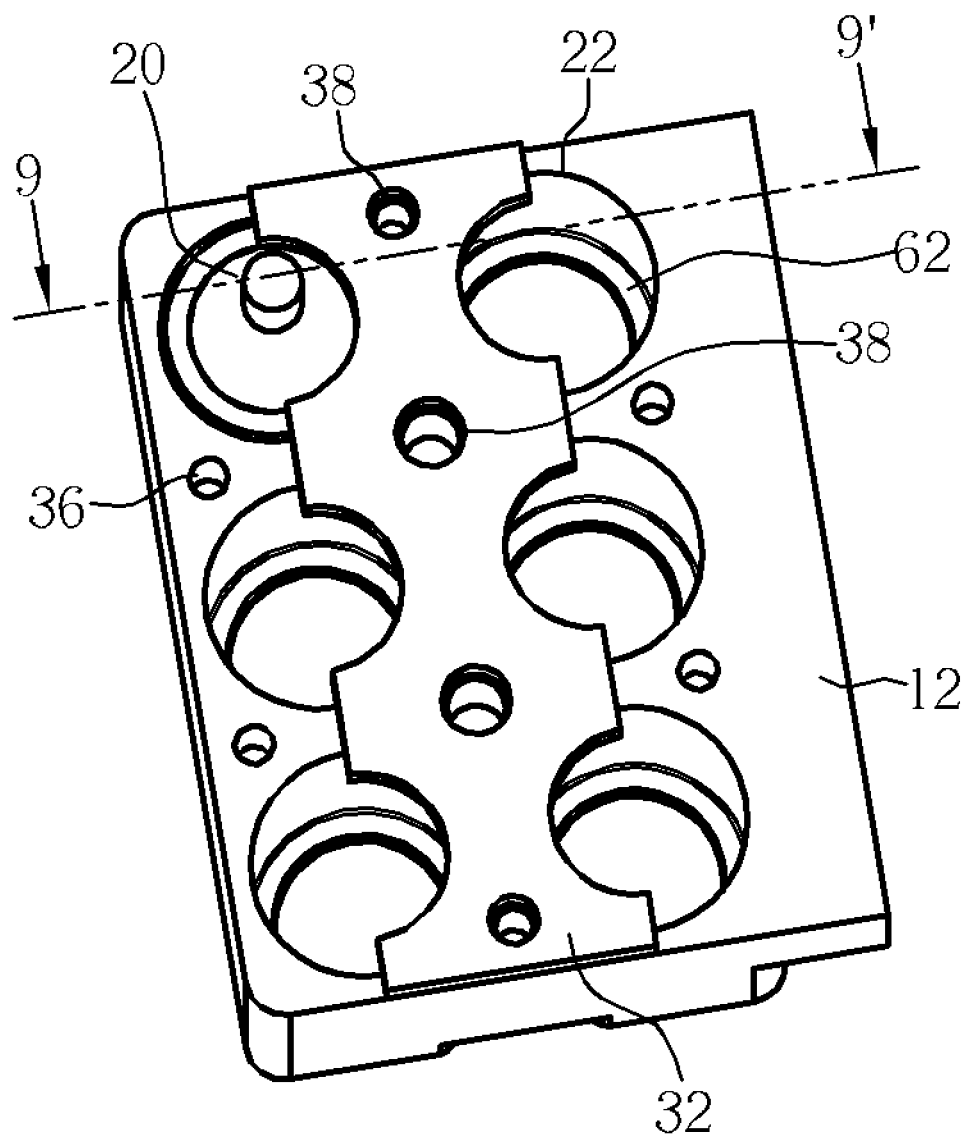
FIG. 8 is a perspective diagram of the socket with the signal terminal and the first fixing unit shown in FIG. 2.
Figure 9:
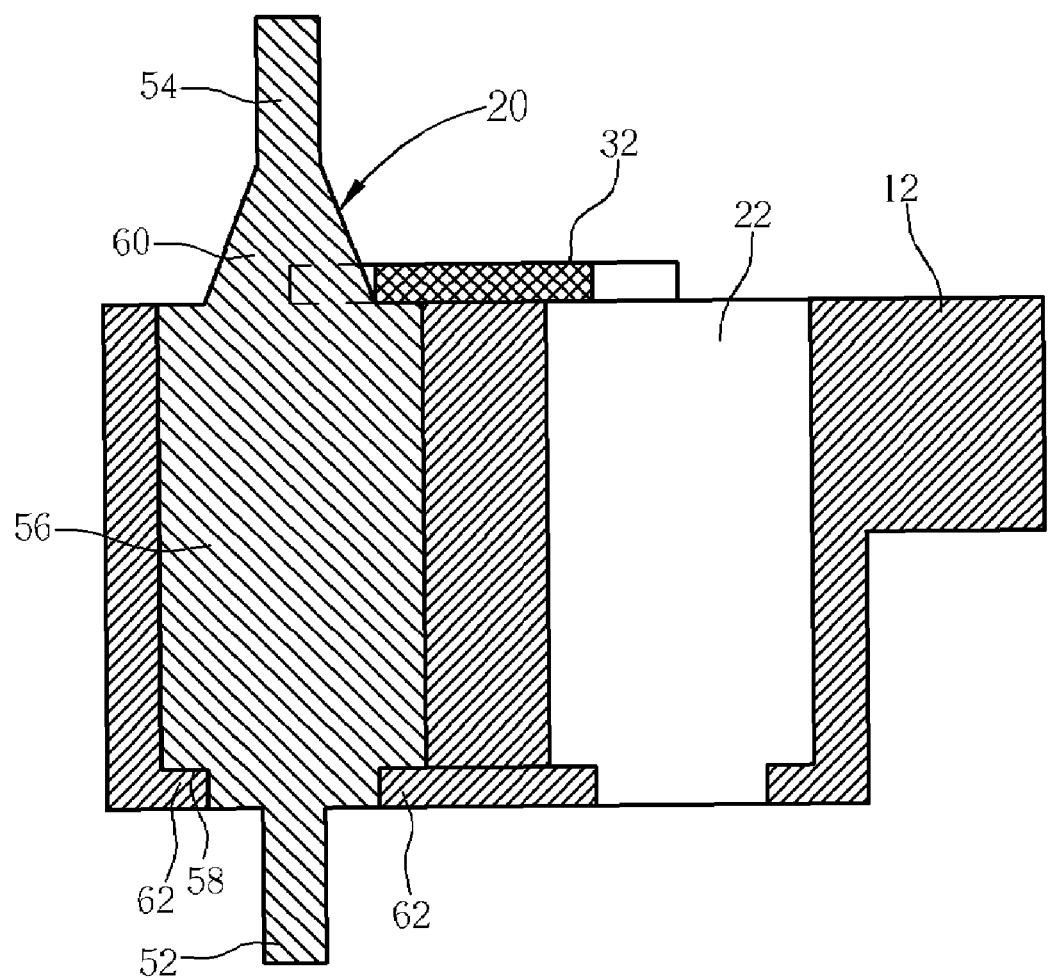
FIG. 9 is a cross-sectional diagram of the socket, the signal terminal, and the first fixing unit along the line 9-9' shown in FIG. 8.
Figure 10:
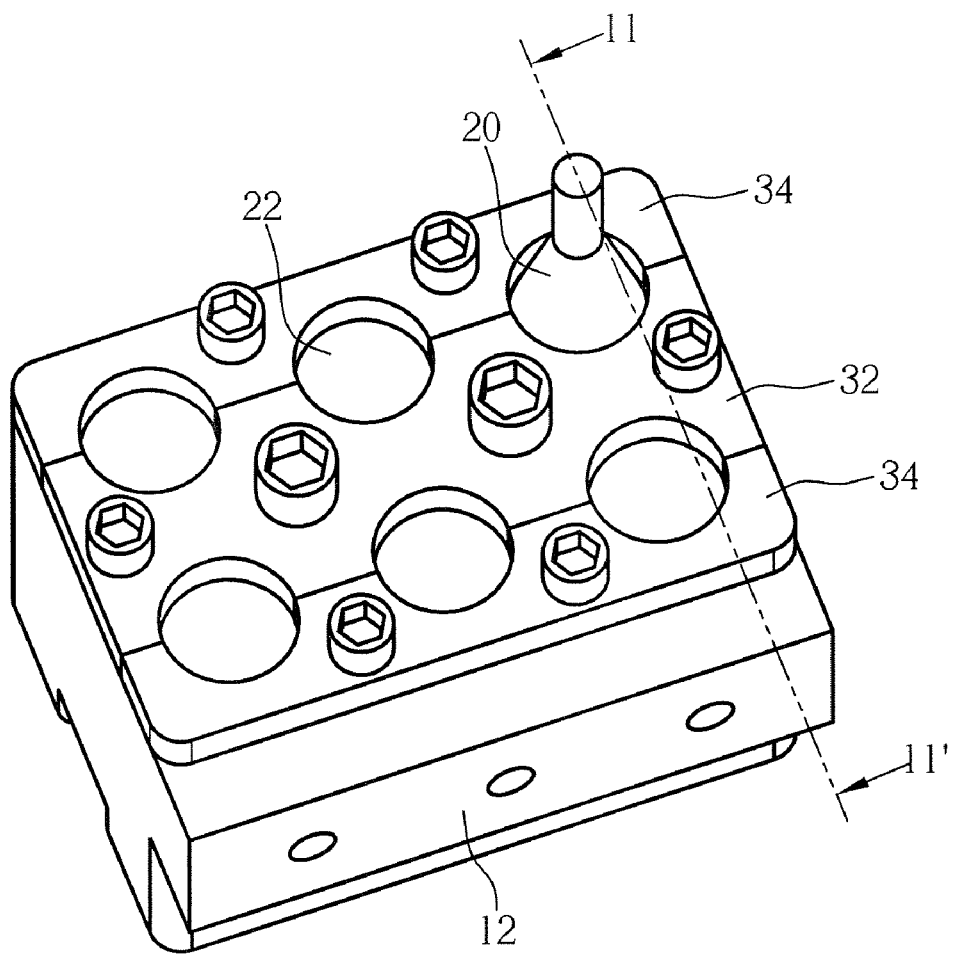
FIG. 10 is a perspective diagram of the socket with the signal terminal and the fixing units of the fixing module shown in FIG. 2.
Figure 11:
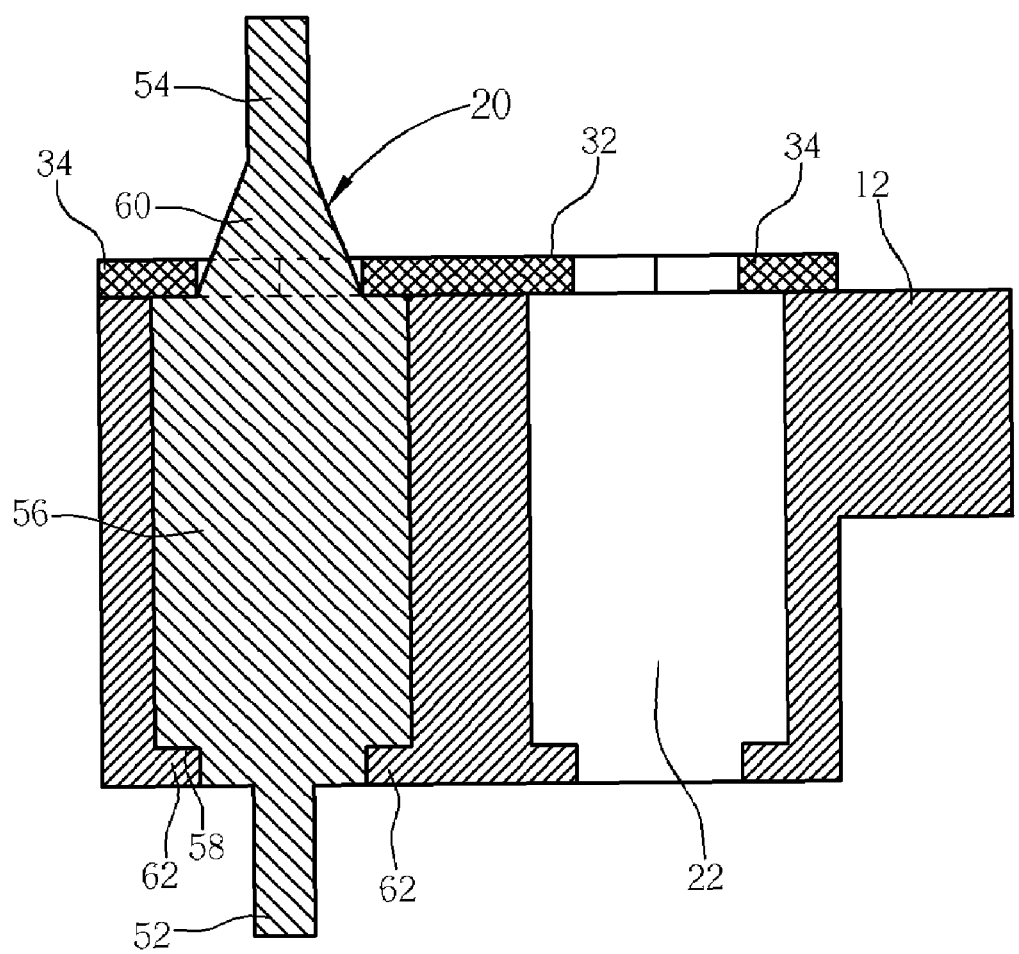
FIG. 11 is a cross-sectional diagram of the socket, the signal terminal, the fixing units along the line 11-11' shown in FIG. 10.

In the following description, more details about the structures of signal terminals 20 and the holes 22 of the socket 12 and the conjunction between the holes and signal terminals 20 will be explained. Please refer to FIGS. 3-4. FIG. 3 is a perspective diagram of the socket 12 shown in FIG. 2, and FIG. 4 is a cross-sectional diagram of the socket 12 along the line 4-4' shown in FIG. 3. There is a protrusion 62 formed in each of the holes 22, and each of the protrusions 62 is a part of the bottom of the socket 12. The protrusion 62 is a protruding ring. When the signal terminal 20 is installed in the hole 22 of the socket 12, the protrusion 62 of the hole clamps one end of the signal terminal 20. Please refer to FIG. 5-7. FIG. 5 is a perspective diagram of the signal terminal 20, FIG. 6 is a perspective diagram of the socket 12 with a signal terminal 20 installed in the hole 22, and FIG. 7 is a cross-sectional diagram of the socket 12 and the signal terminal 20 along the line 7-7' shown in FIG. 6. The outer diameter of the body 56 of the signal terminal 20 is approximately equal to the inner diameter of the hole 22, so the body 56 of the signal terminal 20 tightly contacts the surface of the hole 22 when the signal terminal 20 is installed in the hole 22. Therefore, the signal terminal 20 cannot be easily horizontally shaken when installed in the hole 22. The body 56 of the signal terminal 20 has a first end 58 and a second end 59. When the signal terminal 20 is installed in the hole 22, the first end 58 of the body 56 contacts the protrusion 62 of the hole 22 so that the signal terminal 20 is restricted from moving down. Please refer to FIGS. 8-9. FIG. 8 is a perspective diagram of the socket 12 with the signal terminal 20 and the first fixing unit 32, and FIG. 9 is a cross-sectional diagram of the socket 12, the signal terminal 20, and the first fixing unit 32 along the line 9-9' shown in FIG. 8. When the first fixing unit 32 is screwed onto the socket 12, the second end 59 of the body 56 of the signal terminal 20 contacts the first fixing unit 32 so that the signal terminal is restricted from moving upward. Therefore, with the help of the protrusion 62 and the first fixing unit 32, the signal terminal 20 can be fixed in the hole 22. Please refer to FIGS. 10-11. FIG. 10 is a perspective diagram of the socket 12 with the signal terminal 20 and the fixing units 32 and 34 of the fixing module 30, and FIG. 11 is a cross-sectional diagram of the socket 12, the signal terminal 20, the first fixing unit 32, and the second fixing units 34 along the line 11-11' shown in FIG. 10. The two second fixing units 34 are used to enhance the restriction in upward movement of the signal terminal 20. The second fixing units 34 are fixed on the socket 12 via the screws 40. Each of the second fixing units 34 contacts the first fixing unit 32 so that the cone 60 of the signal terminal 20 is clipped between the first fixing unit 32 and one of the second fixing units 34. It should be noted that the second fixing units 34 can be omitted from the fixing module 30.

Figure 12:
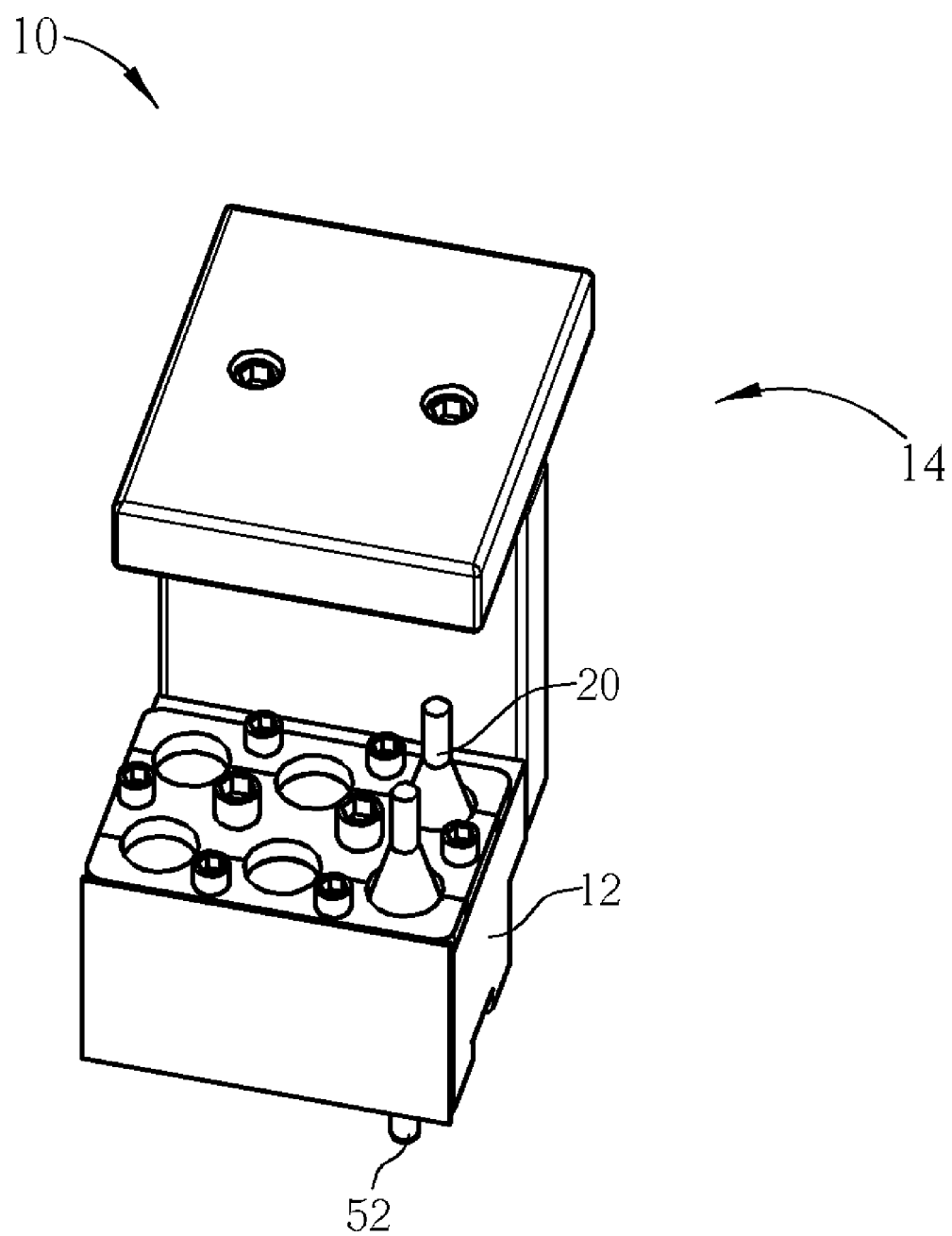
FIG. 12 is a perspective diagram to show a second way to use the test fixture shown in FIG. 2.
Figure 13:
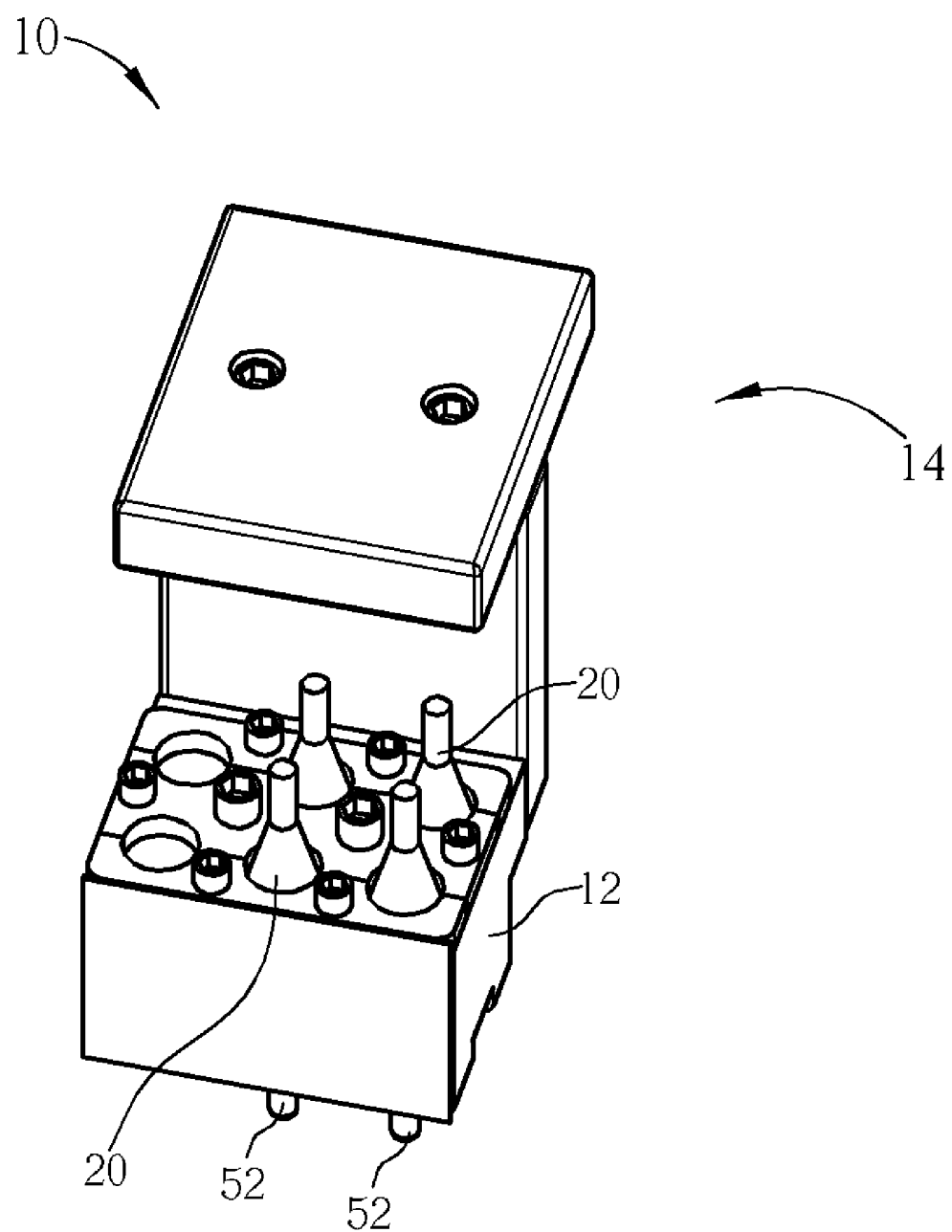
FIG. 13 is a perspective diagram to show a third way to use the test fixture 10 shown in FIG. 2.

As mentioned previously, the number of signal terminals 20 installed in the socket 12 can be changed according to the needs of the QC tests. When the QC employee wants to change the number of signal terminals 20 installed in the socket 12, he/she just needs to remove the fixing units 32 and 34 of the fixing module 30 and rearrange the signal terminals 20 before fastening the fixing module 30 again. Please refer to FIGS. 12-13. FIG. 12 is a perspective diagram to show a second way to use the test fixture 10, and FIG. 13 is a perspective diagram to show a third way to use the test fixture 10. In FIG. 12, the test fixture 10 has two signal terminals 20. In FIG. 13, the test fixture 10 has four signal terminals 20. The number of signal terminals 20 of the test fixture 10 of the present invention is not limited by the above embodiments.

Figure 14:
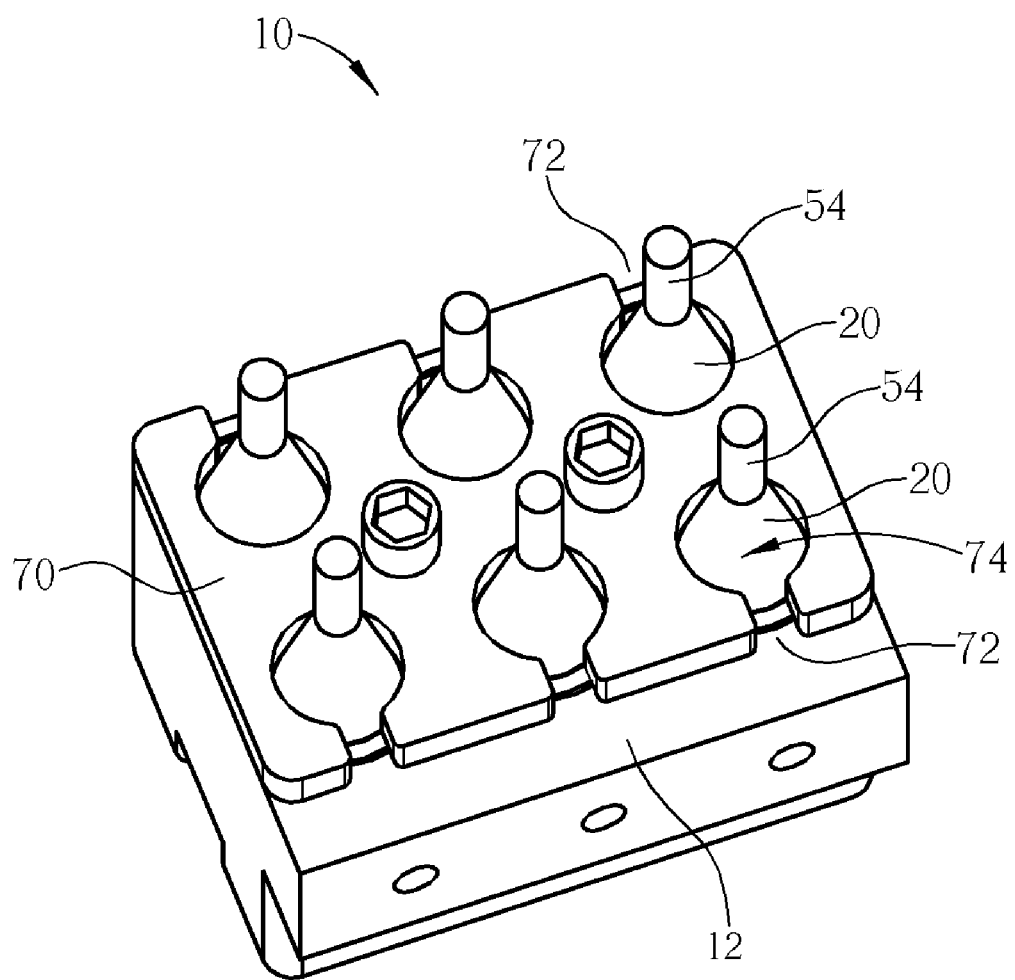
FIG. 14 is a perspective diagram of the socket shown in FIG. 2 with a fixing component.

Please refer to FIG. 14, which is a perspective diagram of the socket 12 with a fixing component 70. The purpose of the fixing component 70 is the same as that of the first fixing unit 32 of the fixing module 30 that is used to restrict the signal terminals 20 from moving in the holes 22. Differently, the size of the fixing component 70 is greater than the size of the first fixing unit 32. The fixing component 70 has a plurality of gaps 72 and a plurality of openings 74. The width of each gap 72 is less than the maximum diameter of the cone 60 and greater than the diameter of the pin 54, so the fixing component 70 can be placed from top to bottom on the socket 12.

Figure 15:
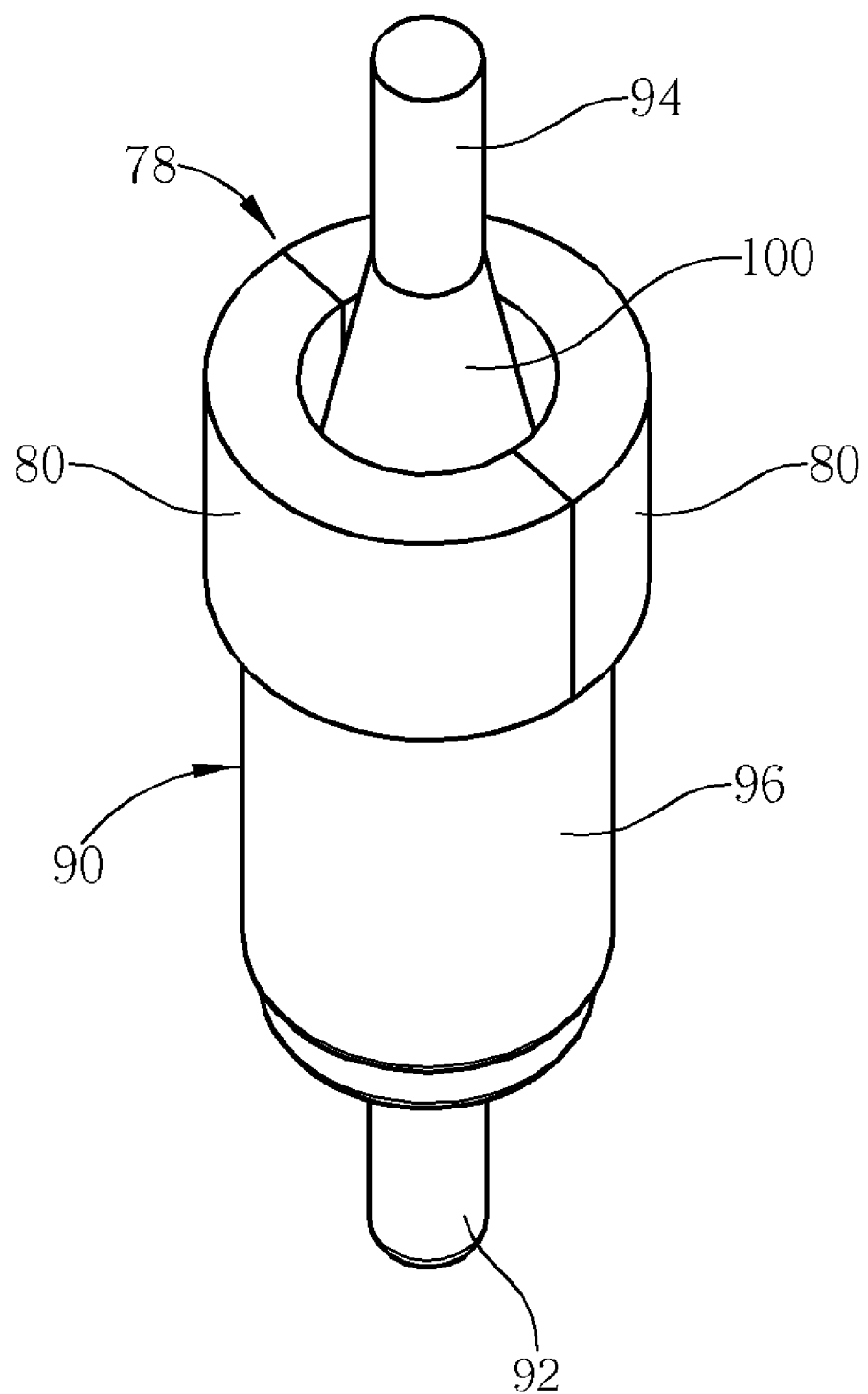
FIG. 15 is a perspective diagram of a plugging module and a signal terminal according to the present invention.
Figure 16:
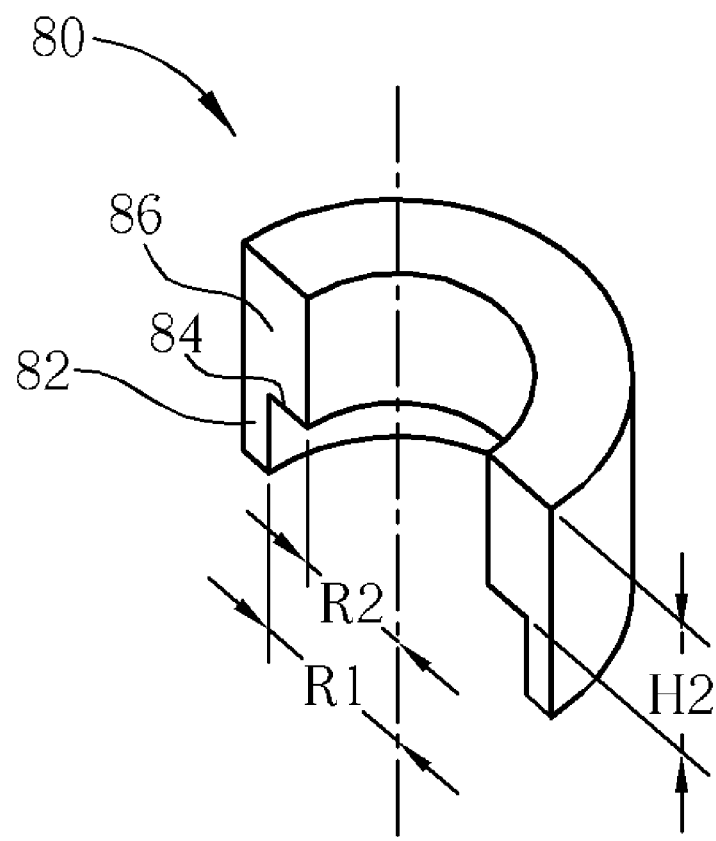
FIG. 16 is a perspective diagram of a plug of the wading module shown in FIG. 15.
Figure 17:
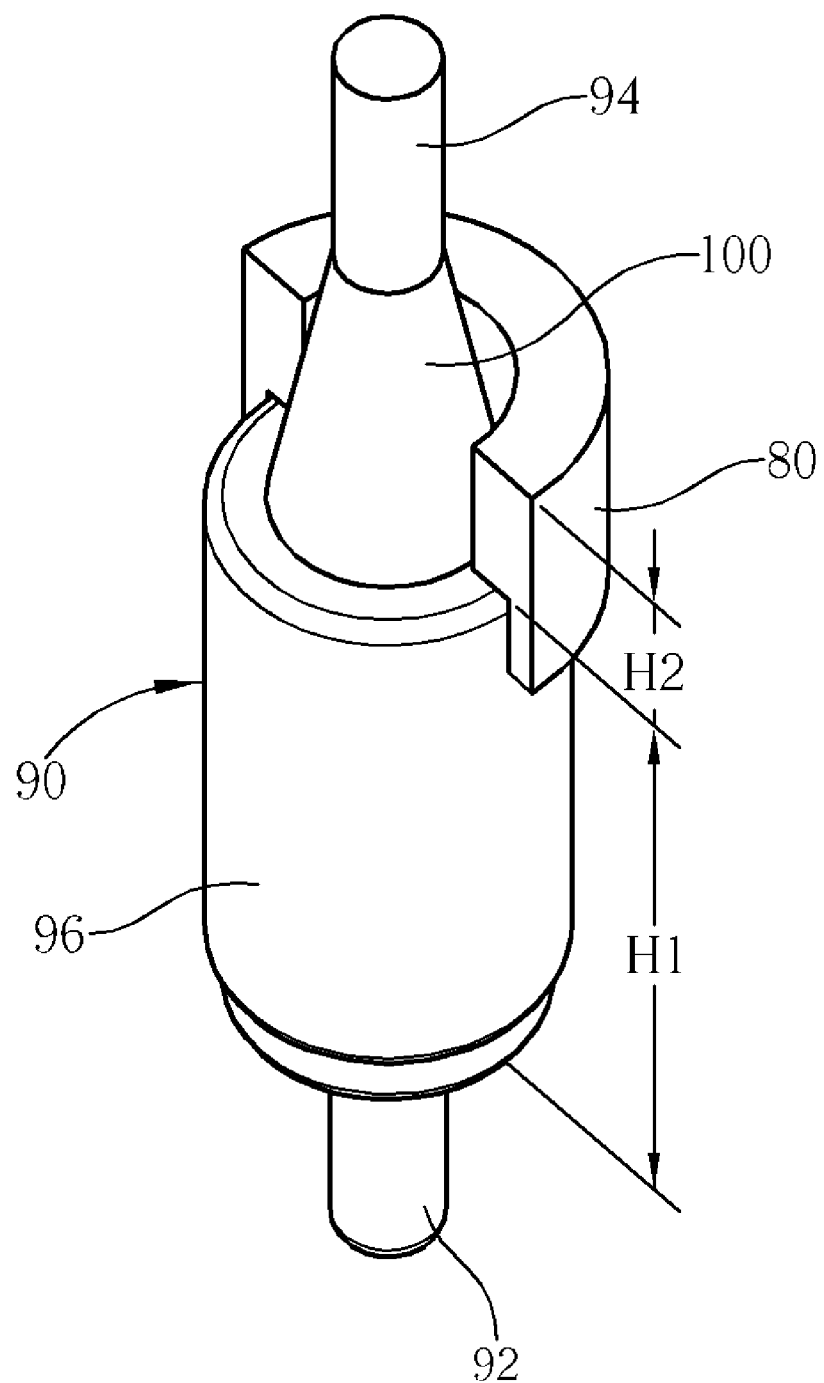
FIG. 17 is a perspective diagram of the signal terminal and the plug shown in FIG. 15.
Figure 18:
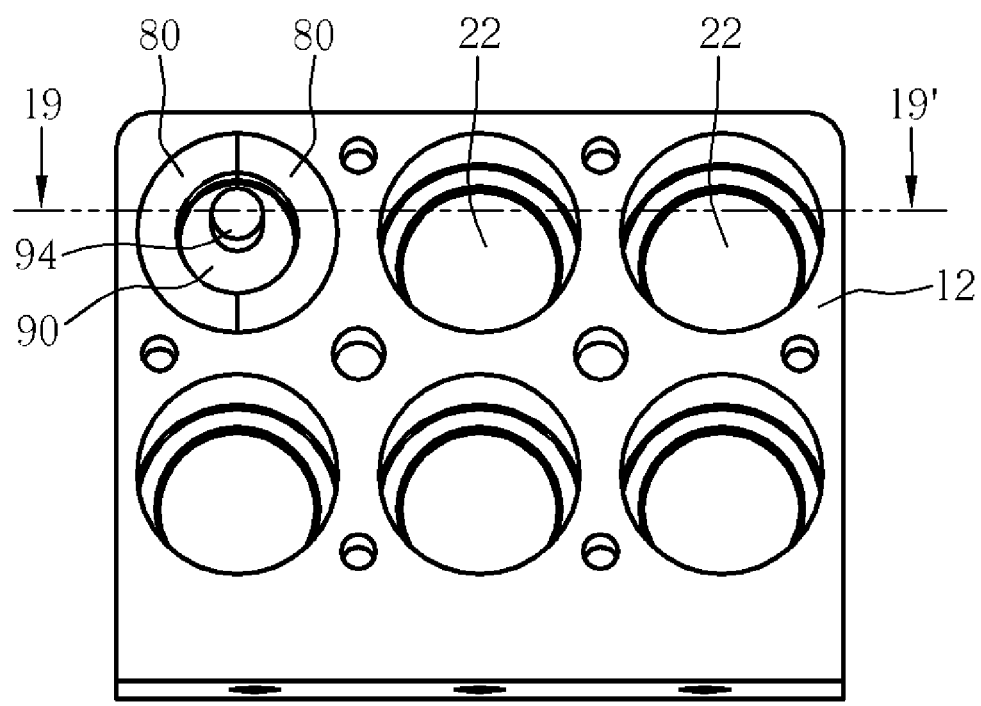
FIG. 18 is a perspective diagram of the socket shown in FIG. 2 with the signal terminal and the plugs shown in FIG. 15.
Figure 19:
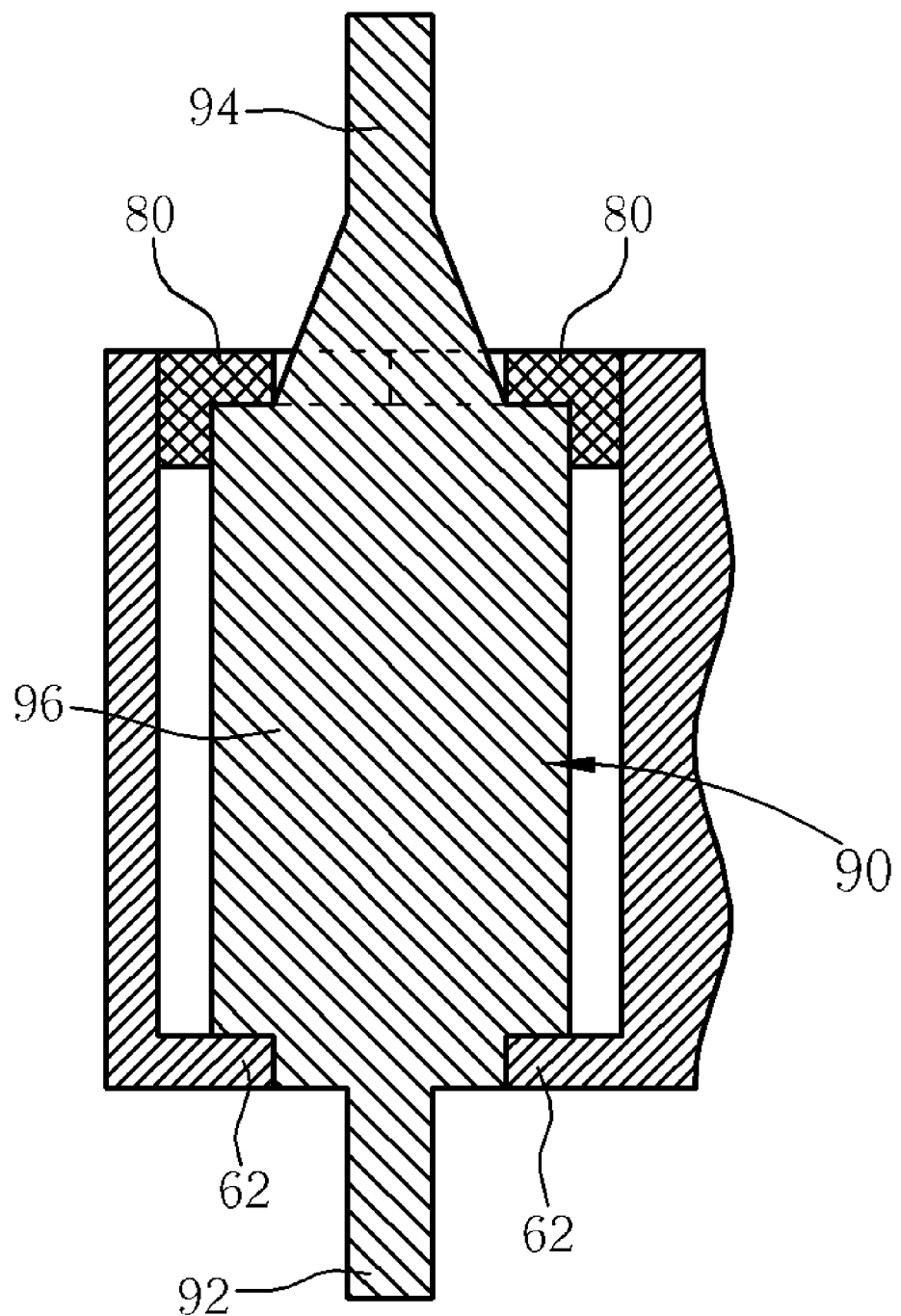
FIG. 19 is a cross-sectional diagram of the socket, the signal terminal, and the plugs along a line 19-19' shown in FIG. 18.

In order to make the test fixture 10 compatible with other signal terminals having shorter length and smaller diameters of the bodies, the test fixture 10 further comprises plugging modules. Please refer to FIGS. 15-17. FIG. 15 is a perspective diagram of a plugging module and a signal terminal 90, FIG. 16 is a perspective diagram of a plug 80 of the wading module 78, and FIG. 17 is a perspective diagram of the signal terminal 90 and the plug 80. Similar to the signal terminal shown in FIG. 5, the signal terminal 90 comprises a probe 92, a pin 94, a body 96, and a cone 100. The length of the body 96 of the signal terminal 90 is less than the length of the body 56 of the signal terminal 20, and the diameter of the body 96 of the signal terminal 90 is less than the diameter of the body 56 of the signal terminal 20. In order to fix the body 96 of the signal terminal 90 in the hole 22, two plugs 80 of the plugging module 78 are used to fill the space of the hole 22. Each of the plugs 80 has a first semicircle 82 and a second semicircle 86. The radius of curvature R1 of the first semicircle 82 is greater than the radius of curvature R2 of the second semicircle 86. Therefore, a recessed portion 84 is formed inside the plug 80. The recessed portions 84 of the two plugs 80 of the plugging module 78 contact the body 96 to hold the signal terminal 90 in the hole 22. When combining the plugs 80 with the signal terminal 90, the sum of the length H1 of the body 96 and the length H2 of the second semicircle 86 is equal to the length of the body 56 of the signal terminal 20 shown in FIG. 5. Please refer to FIGS. 18-19. FIG. 18 is a perspective diagram of the socket 12 with the signal terminal 90 and the plugs 80, and FIG. 19 is a cross-sectional diagram of the socket 12, the signal terminal 90, and the plugs 80 along a line 19-19' shown in FIG. 18. The plugs 80 tightly contact the inner surface of the hole 22, and the protrusion 62 tightly contacts the bottom of the body 96 of the signal terminal 90. Therefore, the body 96 of the signal terminal 90 can be fixed in the hole 22 of the socket 12.

The test fixture of the present invention comprises a socket, a plurality of replaceable signal terminals, and a fixing module for fixing the signal terminals in holes of the socket. Because the number of the signal terminals can be easily changed, the test fixture is fit for various QC tests. In addition, because of the specific structure of the test fixture, the signal terminals fixed in the holes of the socket are resistant to sliding or shaking loose. Therefore, the lifetime of the test fixture is very long.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A test fixture for holding signal terminals, comprising:
  a plurality of signal terminals each comprising a body having a pin and a probe respectively extending from opposite ends of the body;
  a socket formed with a plurality of holes for placing corresponding signal terminals, the socket comprising a plurality of protrusions each of which is formed in a corresponding one of the holes for contacting a first end of the corresponding signal terminal; and
  a fixing module removably attached to the socket for restricting the signal terminals in the holes such that the pin and the probe respectively extend outside of the socket and the fixing module, the fixing module comprising a first fixing unit and a second fixing unit for clamping a second end of each of the signal terminals wherein the signal terminals are respectively restricted between the fixing modules and the protrusions formed in the holes;
  wherein each of the signal terminals comprises a cone extending from the second end of the signal terminal and the second fixing unit contacts the first fixing unit so that the cone of the signal terminal is clipped between the first fixing unit and the second fixing unit.

2. The test fixture of claim 1 further comprising a handle connected to the socket, the handle comprising:
  a stick having a first end connected to the socket; and
  a shaft connected to a second end of the stick.

3. The test fixture of claim 1 wherein the fixing module is screwed on the socket.

4. The test fixture of claim 1 further comprising a pad disposed on one side of the socket for preventing scraping.

5. The test fixture of claim 4 wherein a friction coefficient of the pad is less then a friction coefficient of the side of the socket.

6. The test fixture of claim 1 wherein the protrusions are protruding rings.

7. The test fixture of claim 1 further comprising a plurality of plugging modules correspondingly disposed in the holes, the signal terminals are restricted between corresponding plugging modules and the protrusions formed in the corresponding holes, and each of the plugging modules is positioned between a corresponding signal terminal and the fixing module and contacts the corresponding signal terminal and the fixing module.

8. The test fixture of claim 7 wherein at least one of the plugging module comprises a first plug and a second plug.

9. The test fixture of claim 8 wherein at least one of the plugging modules is formed as a ring shape and consists of the first plug and the second plug.

10. The test fixture of claim 8 wherein the first plug and the second plug have a recessed portion for receiving the corresponding signal terminal.

11. A method for assembling a test fixture and a plurality of signal terminals, the method comprising:
  installing a plurality of signal terminals into a plurality of holes of a socket to make a first end of each of the signal terminals contact with a protrusion formed in a corresponding hole;
  removably installing a fixing module on the socket to restrict the signal terminals in the holes while exposing a probe and a pin of each of the signal terminals outside the socket and the fixing module, the fixing module comprising a first fixing unit and a second fixing unit screwed onto the socket and contacting second ends of each of the signal terminals wherein each of the signal terminals comprises a cone extending from the second end of the signal terminal; and
  clipping the cone between the first fixing unit and the second fixing unit.

12. The method of claim 11 further comprising:
connecting a handle to the socket.

13. The method of claim 11 further comprising:
  installing a pad on one side of the socket to prevent scraping.

14. The method of claim 11 further comprising:
  installing a plurality of plugging modules in the holes of the socket to fix each of the signal terminals between one of the plugging modules and the protrusion formed in the corresponding hole, wherein each of the plugging modules is positioned between the corresponding signal terminal and the fixing module and contacts the corresponding signal terminal and the fixing module.

* * * * *